United States Patent [19]

Gilbert et al.

[11] 4,076,959
[45] Feb. 28, 1978

[54] VOLUME, TONE AND BALANCE CONTROL FOR MULTI-CHANNEL AUDIO SYSTEMS

[75] Inventors: William F. Gilbert; Burtron D. Schertz; Lester Wilkinson, all of Kokomo, Ind.

[73] Assignee: General Motors Corporation, Detroit, Mich.

[21] Appl. No.: 730,950

[22] Filed: Oct. 8, 1976

[51] Int. Cl.² .................... H03G 5/10; H03G 3/10; H03F 3/45
[52] U.S. Cl. .................... 179/1 D; 179/1 VL; 330/254
[58] Field of Search .................... 179/1 D, 1 G, 1 VL, 179/1 GQ; 330/30 D, 29

[56] References Cited

U.S. PATENT DOCUMENTS

| 3,725,583 | 4/1973 | Gunderson et al. | 179/1 VL |
| 3,769,459 | 10/1973 | Niffenegger et al. | 179/1 VL |
| 3,849,601 | 11/1974 | Goncharoff | 179/1 D |
| 3,870,964 | 3/1975 | Mills | 330/29 |
| 3,875,334 | 4/1975 | Hilbert et al. | 179/1 D |
| 3,908,172 | 9/1975 | Aschermann et al. | 330/30 D |
| 3,937,885 | 2/1976 | Gay | 179/1 VL |
| 3,949,325 | 4/1976 | Berkovitz | 179/1 D |

OTHER PUBLICATIONS

"Semiconductor Data Library", vol. 6, series B, Motorola, Inc., 1976, pp. 7-169 to 7-171.
"An Integrated Quadraphonic DC Volume Control", John E. Hanna, IEEE Trans. BTR, vol. BTR-20, No. 1; pp. 15-31, Feb. 1974.

Primary Examiner—Kathleen H. Claffy
Assistant Examiner—Kenneth A. Chayt
Attorney, Agent, or Firm—Albert F. Duke

[57] ABSTRACT

Control circuitry for a multi-channel audio system is disclosed which includes left and right signal processing channels and a DC control section. Each processing channel includes balance and volume sections which are connected with the DC control circuitry and controlled from respective balance and volume potentiometers connected with the DC control section. Each channel further includes a tone control section and more specifically treble and bass sections connected with the DC control circuitry and controlled from a tone potentiometer. The response of the bass section is also controlled as a function of the setting of the volume potentiometer to achieve a loudness function. The volume control circuitry is designed to produce a linear relationship between the DC control voltage and signal attenuation as measured in decibels. Current steering circuitry is employed in both amplitude and tone control.

9 Claims, 7 Drawing Figures

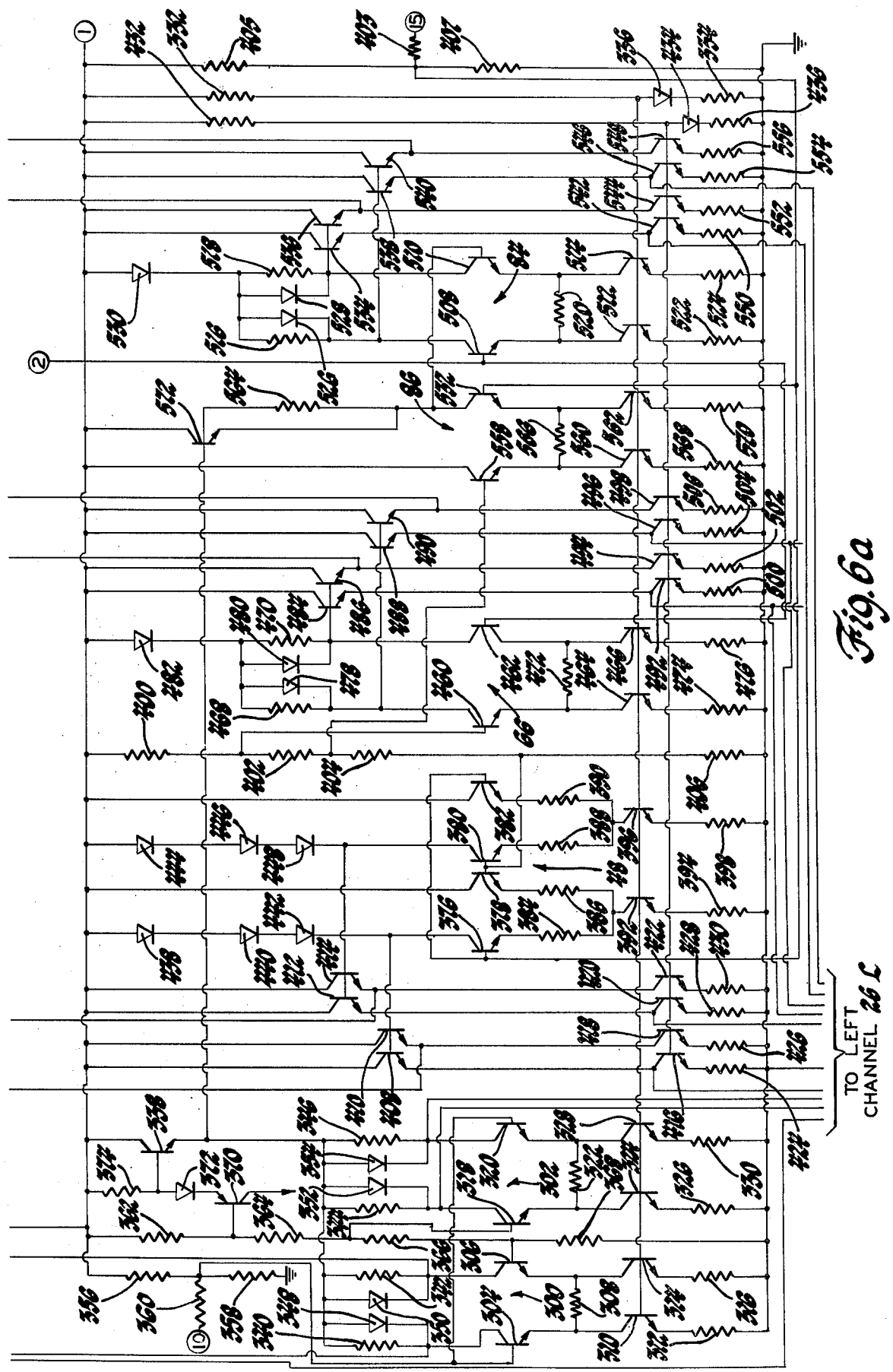

4,076,959

VOLUME, TONE AND BALANCE CONTROL FOR MULTI-CHANNEL AUDIO SYSTEMS

This invention relates to audio control circuitry and more particularly to circuitry for electronically controlling audio functions such as tone, volume and balance in a multi-channel receiver.

It has been proposed in the prior art to provide a variable DC voltage for electronically controlling tone, volume and balance of the audio output of a receiver. An example is the patent to Hilbert et al U.S. Pat. No. 3,875,334. There are a number of advantages of electronic control of audio functions. For example, a single potentiometer can be used to generate the DC voltage which can then control a plurality of channels thus eliminating the problems associated with the former requirements of matching potentiometers in such multi-channel applications. Furthermore, greater flexibility in circuit layout is achieved due to the fact that audio signals need not be channeled to the front of the receiver in order to connect the controls. Indeed the controls may be remotely located from the receiver giving greater design freedom in automobile applications.

It is an object of the present invention to provide an improved audio processing and control circuit for controlling one or more audio functions such as balance, volume, tone and loudness.

It is another object of the present invention to provide improved bass response circuitry which responds to a tone control potentiometer setting and which also responds to a volume control potentiometer setting to boost the bass response as the volume level is reduced.

It is another object of the present invention to provide an improved volume control circuit which produces a linear relationship between the DC control voltage and signal attenuation as measured in dB.

In accordance with the present invention the left and right audio outputs of a stereo decoder are provided to an integrated circuit including left and right signal processing channels. Each processing channel includes a balance and volume section which is responsive to respective balance and volume potentiometer settings. Each channel further includes a tone control section and more specifically treble and bass sections which are controlled from a tone potentiometer. The response of the bass section is also controlled as a function of the setting of the volume potentiometer to achieve a loudness function.

A more complete understanding of the present invention may be had from the following detailed description which should be read in conjunction with the drawings in which:

FIGS. 6 and 6a are schematic diagrams of portions of the circuitry shown in FIG. 1.

Figure 1:
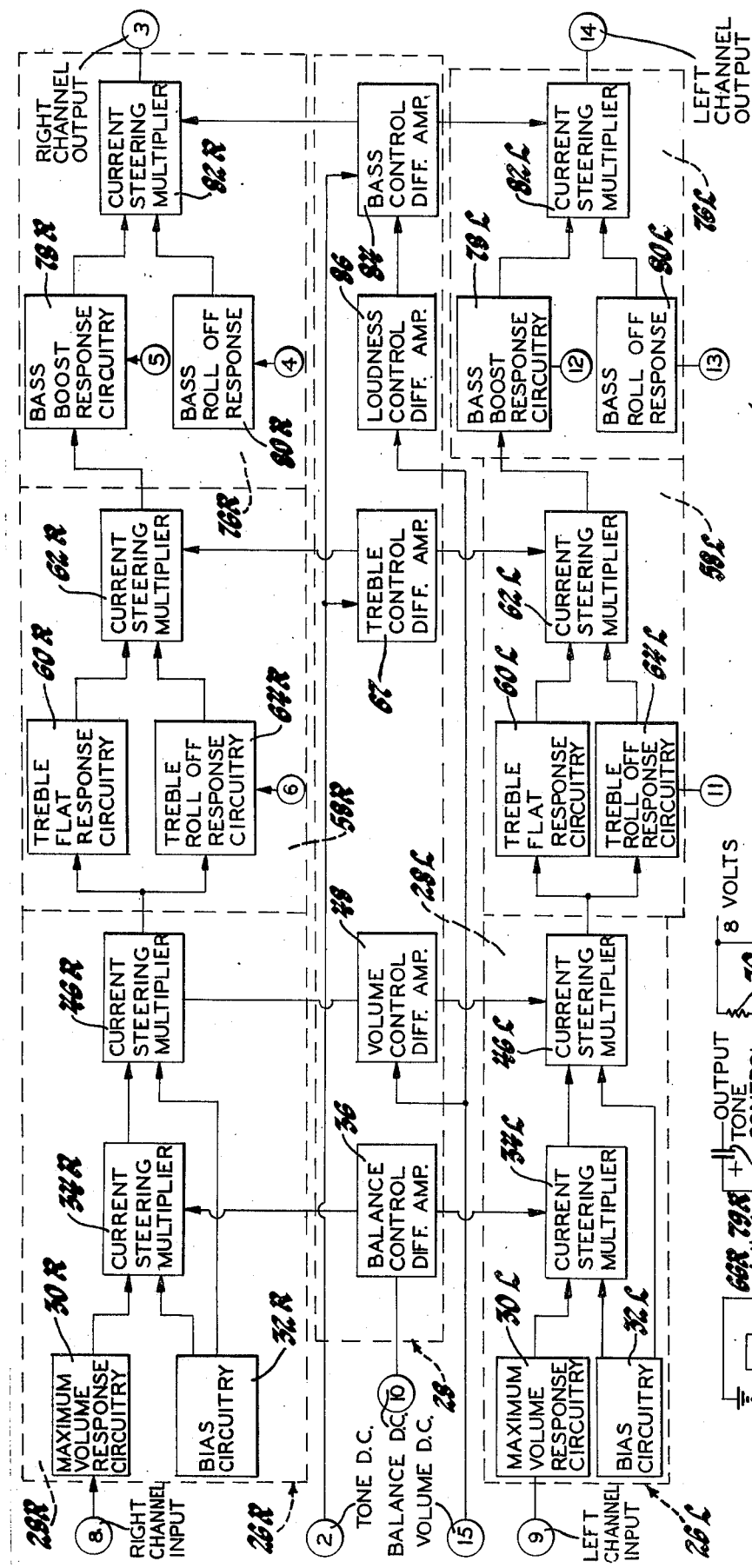
FIG. 1 is a block diagram of the audio processing and control circuit of the present invention.
Figure 2:
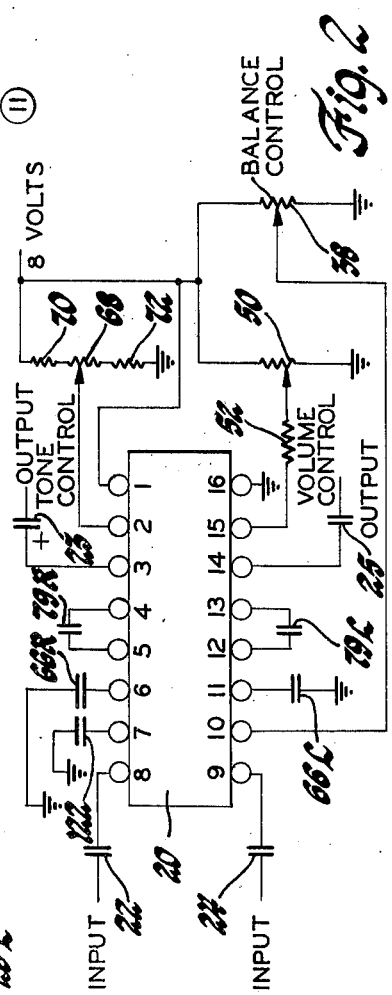
FIG. 2 shows the external electronic components and their connection with the circuit of FIG. 1 as constructed in integrated circuit form.

Referring now to the drawings and initially to FIGS. 1 and 2, the integrated circuit of the present invention is generally designated 20. The right audio input signal from the stereo decoder (not shown) is applied to pin 8 of the circuit 20 through a coupling capacitor 22. Similarly the left audio input signal is applied to pin 9 through a capacitor 24. The right and left audio output signals are coupled to respective audio amplifiers (not shown) through capacitors 23 and 25 connected to pins 3 and 14 respectively. The circuit 20 comprises three sections, a right signal processing channel generally designated 26R, a left signal processing channel generally designated 26L and a DC control section generally designated 28. The signal channels 26R and 26L extend between pins 8 and 3 and 9 and 14 respectively and are identical. Therefore, in the interest of brevity only the right signal processing channel 26R will be described in detail. Corresponding components in the left channel are referenced by the same numerals followed by the letter L. The voltage gain, input to output, of each of the channels 26R and 26L is equal to or slightly less than unity at 1000 Hz. The audio input signal at pin 8 is an AC voltage which is fed to a balance and volume section generally designated 28R. The section 28R includes circuitry 30R which converts the voltage signal to a modulated DC current which is, at unity gain through the channel, the maximum signal that can appear at the output at 1000 Hz. An unmodulated DC current (no signal current) is produced in bias circuitry generally designated 32R and represents the minimum volume signal current. A current steering multiplier 34R provides an output current consisting of complementary percentages of the two input currents such that the DC level of the output current is always the same. The output of the multiplier 34R can vary from the full input signal current from circuitry 30R, corresponding to maximum volume on the right channel, to all of the unmodulated current input from the circuitry 32R, corresponding to minimum volume. The corresponding components in the left channel 26L perform the same function in the left channel signal flow. The current steering multipliers 34R and 34L are controlled from a balance control circuit 36 which in turn is responsive to a DC control voltage from a balance potentiometer 38 connected to pin 10. The balance control voltage can vary between 0.0 and 8.0 volts DC. The balance control circuitry 36 comprises two differential amplifiers, one to control each of the multipliers 34R and 34L. At 4.0 volts DC both differential amplifiers produce conditions which cause both multipliers 34R and 34L to be in the maximum volume condition, i.e. neither channel signal is affected. As the balance control voltage is increased above 4.0 volts DC, the multiplier 34R continues to pass the maximum volume input current and the multiplier 34L begins to attenuate the volume in the left channel signal. The left channel signal is gradually attenuated more as the balance DC control voltage is increased above 4.0 volts DC until no signal is passed through the left channel at approximately 8.0 volts DC. At 8.0 volts DC the right channel remains at maximum signal setting. As the balance DC control voltage is reduced below 4.0 volts DC the multiplier 34L causes the left channel signal to remain at maximum signal level and the multiplier 34R begins to attenuate the right channel signal until at approximately 0.0 DC volts no signal flows in the right channel 26.

The output of the right channel balance current steering multiplier 34R is fed directly to the right channel volume current steering multiplier 46R. A similar signal flow is followed in the left channel 26L. The volume current steering multipliers 46R and 46L are connected in parallel to simultaneously control the volume level in both channels. Each volume current steering multiplier has two inputs. The above mentioned signal current from the balance current steering multiplier 34R is one input to the multiplier 46R while the other input is the unmodulated DC current representing a minimum volume signal from the circuitry 32R. The output of the multiplier 46R is a current which is a summation of complementary percentages of the two input currents such that the output can vary from all of the signal input current from the multiplier 34R which represents maximum volume, to all of the unmodulated DC input current from the circuitry 32R which represents minimum volume.

The multipliers 46R and 46L are controlled from a dual differential amplifier 48 which in turn is responsive to a DC control voltage from a volume potentiometer 50. The potentiometer 50 is connected to pin 15 through a resistor 52. The amplifier 48 produces a linear relationship between the change in the control voltage from the volume potentiometer 50 and the change in signal attenuation as measured in dB. This relationship is desirable to allow for balancing the two front channels on one integrated circuit against the two rear channels on a second integrated circuit in quadraphonic applications. This balance function could be achieved by introducing a voltage difference between the volume control voltages being fed to the two integrated circuits which would cause one pair of channels to operate at a different volume level than the other pair of channels. If the relationship between the volume control voltage and the resulting attenuation in dB is not linear, a fixed differential volume voltage between the two integrated circuits will produce a varying difference in signal levels between the channel pairs on the two integrated circuits as the volume control voltage is varied. In other words, the balance function would vary as the volume level was varied. The linear relationship eliminates the balance variance between the two integrated circuits.

The voltage signal developed at the output of multiplier 46R is fed through two signal paths in a treble section generally designated 58R. One path through circuitry generally designated 60R directly converts the input voltage signal into a modulated DC current and passes the signal current unchanged to a current steering multiplier 62R. This represents a treble function which is shaped (over frequency) the same as the input signal at pin 8. If the response of the input signal at pin 8 is flat with frequency, the modulated signal current at the output of circuitry 60R will be flat with frequency. Therefore, in the treble position on the tone control, all of this signal current would be fed to the output of the current steering multiplier 62R and the treble response would be flat. If a boost in the high frequency response is desired in the treble position, the input signal at pin 8 must be shaped in that manner, i.e. pre-emphasized, before it is fed to pin 8. For instance, the amount of stereo decode de-emphasis could be reduced to allow the upper audio frequencies to be higher in levels than mid-range and lower audio frequencies at the input to the chip 20, therefore allowing a treble boost in the treble position.

Figure 3:
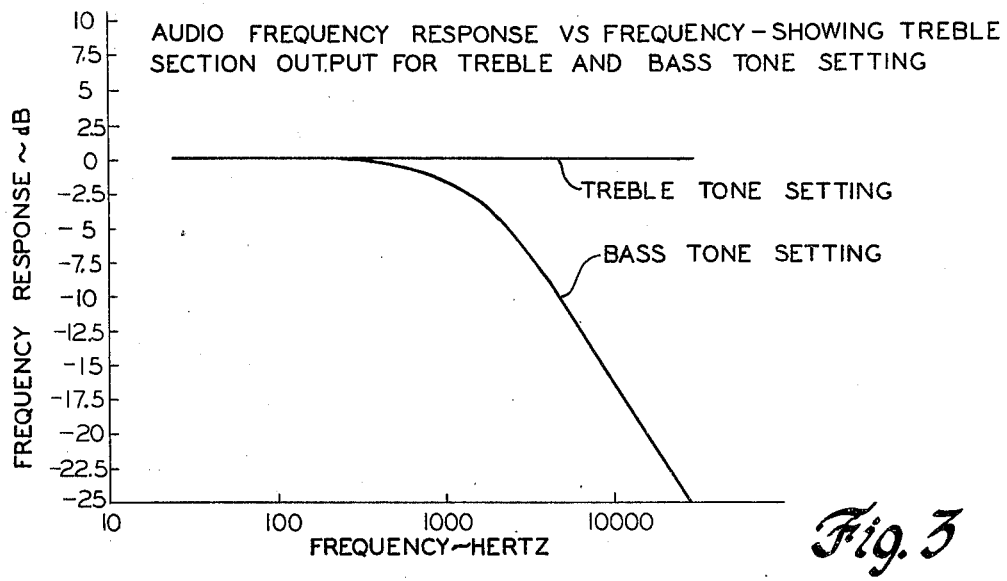
FIG. 3 depicts the audio frequency response versus frequency of the treble section of the integrated circuit of the present invention.

The second signal path in the treble section 58R is through circuitry 64R which includes a resistor in series with the signal path. One end of the resistor is connected to pin 6 which is connected to an external capacitor 66R to ground. The RC combination produces an attenuation of the higher audio frequencies in a manner required for a bass tone setting. The rolled off audio voltage signal is then converted to a modulated DC current which becomes the second input to the current steering multiplier 62R. The output of the multiplier 62R is a summation of complementary percentages of the two input currents and can therefore vary from a treble flat response or treble boost to a rolled off treble response. The percentages of the input currents to the multiplier 62R which appears in the output current of the multiplier 62R is determined by the DC input voltage to a control differential amplifier 67. The input voltage to the amplifier 67 is provided from a tone control potentiometer generally designated 68. The potentiometer 68 is connected in series with resistors 70 and 72 which establish a control range of 4.4 to 5.5 volts. The audio frequency response of the treble section 58R for treble and bass tone settings is shown in FIG. 3. The differential amplifier 67 includes an internal 5.0 volt reference. The tone control voltage varies between 4.4 volts and 5.5 volts as determined by the setting of the potentiometer 68. At 4.4 volts the treble response is rolled off and at 5.5 volts the treble response is flat, or boosted depending on the shape of the input signal response. The differential amplifier 66 controls the multipliers 62R and 62L simultaneously so that the treble responses for both the left and right channels are simultaneously controlled. At this point in the two channels, the audio signals have been adjusted for balance, volume level and treble frequency response. The input and output load resistors of the treble section 58R are equal so that unity gain is achieved.

The output current of the multiplier 62R is converted to a voltage signal and fed to a bass section generally designated 76R. The bass section includes circuitry generally designated 78R which shapes the frequency response to a bass boost response. The channel signal passes through the circuitry 78R to an external capacitor 79R connected to pin 5 and into circuitry 80R through pin 4. The circuitry 80R produces a bass-cut response where the bass frequency is attenuated relative to the mid-range and upper audio frequencies. The ratio of two bass signal path resistances determine how much the mid-range and upper audio frequencies are attenuated relative to the low frequency signals, which essentially determine the bass boost response. At low audio frequencies, the external capacitor 79R operates like an open circuit, and most of the voltage signal from the treble section 58R appears at the output of the bass boost circuitry 78R. As the signal frequency increases, the external capacitor 79R operates more like a short circuit, and the signal level at the output of the bass boost circuitry 78R decreases resulting in a reduction in the signal level of the upper audio frequencies. The attenuation of the upper audio frequencies produces a relative bass boost response. The signal appearing in the bass roll off circuitry 80R increases as the signal frequency increases because the capacitor 79R feeds more signal into the circuitry 80R. At the upper audio frequencies, the signal appearing in the bass boost circuit 78R and the bass-cut circuit 80R are basically the same since the capacitor 79R acts as a short.

Figure 4:
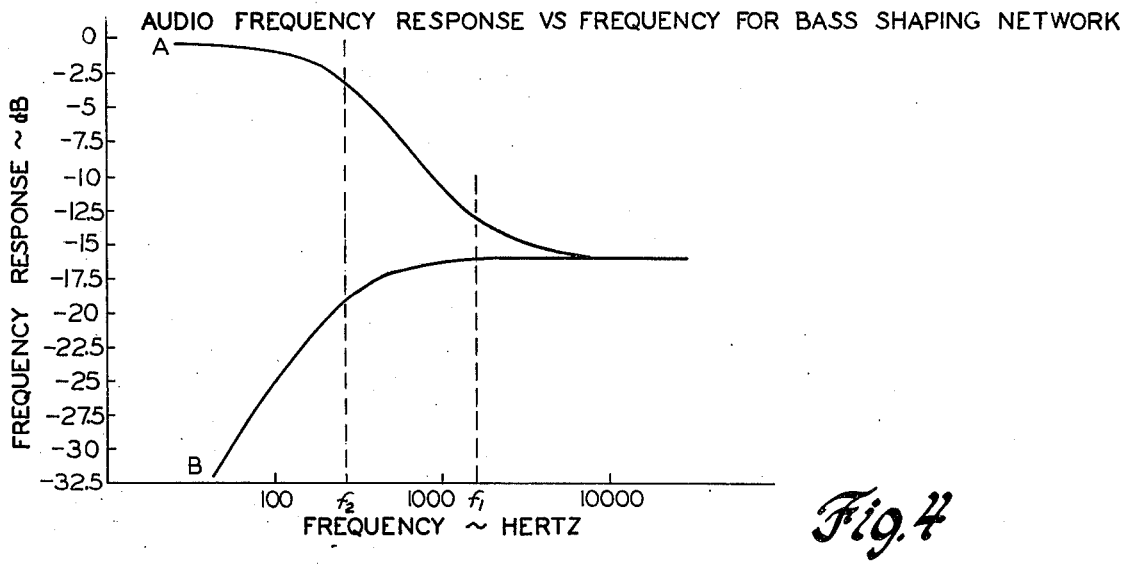
FIG. 4 depicts the audio frequency response versus frequency of the bass section of the integrated circuit of the present invention.

The voltage signals appearing at each end of the capacitor 79R are converted to modulated DC currents and these two currents are fed to a current steering multiplier 82R. The multiplier 82R sums complementary percentages of the two input currents under the control of a differential amplifier 84 to produce an output current signal which can vary from a bass boost response to a bass-cut response. The differential amplifier 84 is also controlled from the tone potentiometer 68. At 4.4 volts the multiplier 82R produces a bass boost response and at 5.5 volts a bass-cut response. The current steering multipliers 82R and 82L are connected in parallel to simultaneously control the bass response in both channels. The signal current output of multiplier 82R is converted to a voltage which is fed to the usual audio power amplifiers (not shown) connected with the right channel output at pin 3. The input and output load resistors of the bass section 76R are equal producing unity gain. The audio frequency response for the bass shaping circuitry 78R, 80R and capacitor 79R is shown in FIG. 4.

Figure 5:
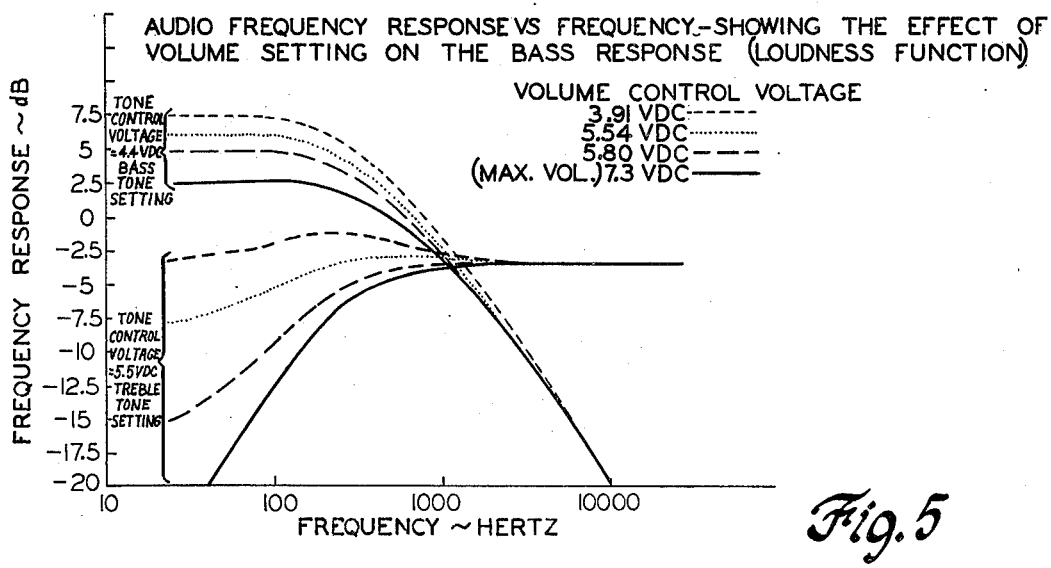
FIG. 5 is a plot depicting the effect of volume setting on the bass response.

The differential amplifier 84 is tied to a reference voltage which is produced by a loudness differential amplifier 86. The reference voltage produced by the amplifier 86 is dependent upon the DC control voltage established by the volume potentiometer 50. The internal reference voltage of the differential amplifier 86 is 4.0 volts. The reference voltage for the amplifier 84 from the amplifier 86 is 4.0 volts when the volume level is set for maximum volume. As the volume level is reduced the internal chip volume control voltage drops from 4.0 volts to 3.0 volts at minimum volume. As the internal chip volume control voltage drops from 4.0 volts, the loudness differential amplifier 86 produces a reference voltage for the amplifier 84 which rises from 4.0 volts to a maximum of approximately 4.7 volts. As the reference voltage for the amplifier 84 increases, the amount of bass boost allowed for the channel signals increases for any given tone setting. Therefore, as the volume level is decreased, the amount of bass boost increases to compensate for the changes in listening efficiency of the human ear at varying loudness levels. The bass boost at 100 Hz increases approximately 6.0 dB as the volume level is reduced from maximum volume to 30.0 dB of signal attenuation. The effects of various volume control voltage settings on the bass response is shown in FIG. 5.

The specific signal flow sequency through the channels 26R and 26L, i.e. balance, volume, treble and then bass, produces several advantages. The balance adjustment is made independent of the volume adjustment to eliminate situations where the volume control circuit overrides the balance adjustment. By making a balance adjustment circuit which is independent of the volume current steering multipliers, the effects of the balance control cannot be overridden by the setting of the volume control. By placing the volume function ahead of the treble and bass functions, the dynamic range requirements for the treble and bass circuits has been reduced. With the volume circuitry ahead of the tone circuitry the signal level in the tone circuitry can be adjusted to whatever level is desirable at the power amplifier input, without requiring the tone circuitry to pass any signals greater than necessary. The volume, treble, and then bass sequence is also important from the standpoint of noise consideration. The location of gain in the signal flow sequence is very important to the noise level which appears at the output of the circuit 20. Gain achieved at the output of the volume section 28R has little effect on the noise level produced at the output of the bass section 76R. Gain achieved in the output of the treble section has some effect on the output noise level; however, gain achieved at the output of the bass section has a significant effect on the noise level being fed to the power amplifier from output pin 3. Consequently all the signal gain in the circuit 20 is achieved at the output of the volume section 28R. The treble section 58R operates at unity gain and the noise level is only slightly affected by the treble setting. The bass section 76R is located last in the sequence because, in order to develop a bass boost response, the mid-range and the high audio frequencies are attenuated approximately 15.0 dB. This attenuation serves to reduce the noise level presented to the audio power amplifier at pin 3.

Figure 6:
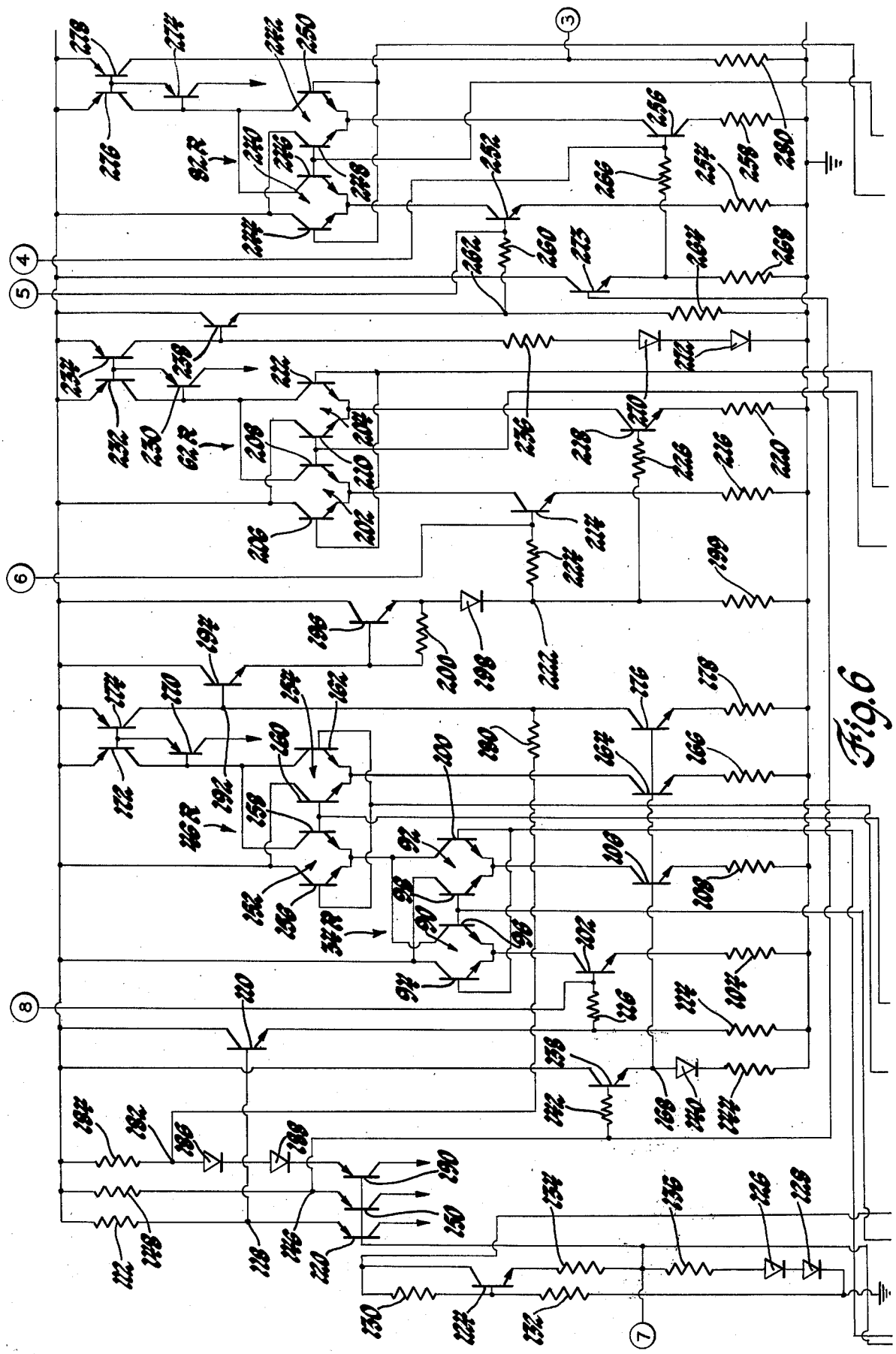

Referring now to FIG. 6, the current steering multiplier 34R comprises differential amplifiers 90 and 92 which include transistors 94 – 100 interconnected as shown. Transistor 102 and emitter resistor 104 act as a current sink for amplifier 90. Transistor 106 and emitter resistor 108 act as a current sink for the amplifier 92. The DC bias for the transistor 102 is established by circuitry which includes transistor 110 and resistors 112, 114, and 116. The transistor 110 has its base connected to a junction 118 between the resistor 112 and the emitter of a substrate PNP transistor 120. The base of 120 is connected with pin 7 which is AC grounded through a filter capacitor 122 (FIG. 2). The voltage on pin 7 is established by a temperature stabilizing network comprising transistor 124, diodes 126, 128 and resistors 130 – 136.

The audio input voltage signal at pin 8 modulates the direct current bias in the collector of transistor 102 while an unmodulated direct current bias is established in the collector of transistor 106 by the no signal bias circuitry 32R which includes transistors 138, diode 140 and resistors 142 and 144. The base of transistor 138 is connected through the resistor 142 to a junction 146 between a resistor 148 and the emitter of substrate PNP transistor 150. The base of transistor 150 is connected with pin 7. Under circumstances where no signal is applied to pin 8, the direct current in the collectors of transistors 102 and 106 are the same. The current steered through the transistors 96 and 100 of the differential amplifiers 90 and 92 is dependent upon the differential voltage applied to the bases of the transistors 94 – 100 from the balance control differential amplifier shown as 36 in FIG. 1. Depending on the differential voltage, a percentage of the collector current of transistor 102 will flow in the collector circuit of transistor 96 and a complementary percentage of the collector current of transistor 106 will flow in the collector circuit of transistor 100.

The current steering multiplier 46R comprises differential amplifiers 152 and 154 which include transistors 156 – 162 interconnected as shown. Transistors 96 and 100 of the multiplier 34R act as a current sink for amplifier 152 while a transistor 164 and emitter resistor 166 act as a current sink for amplifier 154. The base of transistors 106 and 164 are both connected with a junction 168 and their emitter load resistors are the same value so that the collector current of transistor 164 is the same as the collector current of transistor 106. The combined collector currents of transistors 96 and 100 is a modulated direct current which is attenuated in relation to the collector current of transistor 102 as a function of the amount of the collector current of transistor 106 which is steered to the collector of transistor 100. Similarly the combined collector current for transistors 158 and 162 is a modulated direct current which is attenuated relative to the combined collector currents of transistors 96 and 100 as a function of the amount of the collector current of transistor 164 which is steered to the collector circuit of transistor 162. The percentage of the combined collector currents of transistors 96 and 100 which appears in the collector circuit of transistor 158 and the amount of the collector current of transistor 164 which appears in the collector circuit of transistor 162 is dependent on the differential voltage applied to the base of the transistors 156-162 from the volume control differential amplifier 48.

Transistors 170, 172 and 174 form a current mirror, i.e. the collector current of transistor 174 is the same as the collector current of transistor 172. Transistor 176 and emitter resistor 178 form a current sink which essentially subtracts the direct current bias from the collector current of transistor 174. The remaining AC signal current develops a voltage signal across a resistor 180. Resistor 180 is connected with a junction 182 between a resistor 184, diodes 186 and 188 and substrate PNP transistor 190. The quiescent signal voltage on resistor 180 is midway between the base voltage on transistors 174 and 176. This permits maximum peak to peak signal without distortion. The ratio of the resistors 180 and 104 determine the amplification of the AC signal. The AC signal at the junction 192 is applied to a high input impedance level shifting network comprising transistors 194 and 196, diode 198 and resistors 199 and 200. The three diode drop through the transistors 194, 196 and diode 198 is compensated for by the three diode rise through transistor 190 and diodes 188 and 186 so that the bias voltages at transistors 102, 106, 164 and 176 is maintained.

The current steering multiplier 62R comprises differential amplifiers 202 and 204 including transistors 206 – 212. Transistor 214 and emitter resistor 216 form a current sink for the amplifier 202 while transistor 218 and emitter resistor 220 form a current sink for the amplifier 204. The voltage signal at the junction 222 is applied across a resistor 224 and capacitor 66R connected with pin 6 (FIG. 2). Accordingly, a frequency dependent voltage signal developed across the capacitor 66R is applied to the base of transistor 214. The shape of the treble roll off response is determined by the value of the resistor 224 and capacitor 66R. The amount of treble cut can be adjusted by varying the value of the treble capacitor 66R. The voltage signal at the base of transistor 214 is converted to a modulated direct current in the collector of transistors 214. The voltage signal at the junction 222 is applied to the base of transistor 218 through a resistor 226 and produces a modulated direct current in the collector of transistor 218. The combined collector current of transistors 208 and 212 is determined by the percentage of the collector current of transistor 214 which flows in the collector circuit of transistor 208 and the percentage of the collector current of transistor 218 which flows in the collector of transistor 212. The percentages are complementary and determined by the treble control differential amplifier applied to the bases of transistors 206 – 212. Transistors 230, 232 and 234 form a current mirror. The current in the collector of transistor 234 is converted to a voltage across load resistor 236 and modulates the base of transistor 238. The value of the resistor 236 and the resistors 216 and 220 are the same to produce unity gain.

The multiplier 82R comprises differential amplifiers 240 and 242 which include transistors 244 – 250. Transistor 252 and emitter resistor 254 act as a current sink for amplifier 240 while transistor 256 and emitter resistor 258 act as a current sink for amplifier 242. The base of transistor 252 is connected through a resistor 260 to a junction 262 between transistor 238 and load resistor 264. The voltage signal at junction 262 is applied to the resistor 260, capacitor 79R connected between pins 4 and 5, resistors 266 and 268 to ground. The diodes 270 and 272 compensate for the diode drop of the transistors 238 and 252 in one path and the transistors 273 and 256 in the other path. At low frequencies the capacitor 79R essentially operates as an open circuit, and essentially all of the AC signal is applied to the base of transistor 252. As the input signal frequency increases capacitor 79R operates more like a short circuit such that part of the input signal is fed to the base of transistor 256 which increases the AC signal at the base of transistor 256 and decreases the AC signal at the base of 252. At high audio frequencies capacitor 79R operates as a short circuit and the input signal is divided by the ratio of the value of the resistor 266 to the sum of the resistors 260 and 266. The AC signal at the base of transistor 252 equals the signal at the base transistor 256 since the capacitor 79R is essentially a short circuit. Therefore, the aforementioned ratio of resistors determines how much the upper audio frequencies will be reduced relative to the lower audio frequencies, i.e. the amount of relative bass boost, and the time constant formed by the capacitor 79R in series with the resistors 260 and 266 determine the break frequencies $f_1$ and $f_2$ shown in FIG. 4. Transistors 274 – 278 form a current mirror. The current in the collector of transistor 278 is converted to a voltage across load resistor 280.

Referring now to FIG. 6a, the two differential amplifiers of the balance control circuitry are generally designated 300 and 302. The amplifier 300 comprises transistors 304 and 306 having their emitters coupled through a resistor 308. Transistor 310 and emitter resistor 312 serve as a current sink for transistor 304 while transistor 314 and emitter resistor 316 serve as a current sink for transistor 306. The amplifier 302 comprises transistors 318 and 320 having their emitters coupled through a resistor 322. Transistor 324 and emitter resistor 326 serve as a current sink for transistor 318 while transistor 328 and emitter resistor 330 serve as a current sink for transistor 320. The base of each of transistors 310, 314 is connected with a bias network comprising resistors 332, 334 and diode 336. The collectors of transistors 304, 306, 318 and 320 are connected to the emitter of transistor 338 through resistors 340, 342, 344 and 346 respectively and diodes 348, 350, 352 and 354 respectively which form a linearizing network. A voltage divider network comprising resistors 356, 358 and 360 is connected with balance potentiometer 38 at pin 10. The divider network ratios the 0 – 8 volt input of potentiometer 38 down to approximately 2½ – 3½ volts so that the transistors of the amplifiers 300 and 302 operate in their linear region. A bias network comprising resistors 362, 364, 366 and 368 provide a first reference voltage at the base of transistor 306 and a second reference voltage at the base of transistor 318. The offset bias voltage provided by the resistor 366 permits the amplifiers 300 and 302 to attenuate the respective right and left channel signals as the balance potentiometer moves from a midposition to either extreme. Transistors 370, 338 and diode 372 and resistor 374 provide a supply voltage at the emitter of transistor 338 for the amplifiers 300 and 302.

The dual differential amplifier 48 comprises transistors 376 – 382 having respective emitter resistors 384 –

390. Transistor 392 and emitter resistor 394 serve as a current sink for transistors 376 and 378 while transistor 396 and emitter resistor 398 serve as a current sink for transistor 380 and 382. A voltage divider network comprising resistors 400 – 406 provide a reference voltage at the base of transistors 378 and 380. The control voltage from the volume potentiometer connected with pin 15 is applied to the base of transistors 376 and 382. The resistors 403, 406, 407 and 52 connected between the base of transistors 376 and 382 and the potentiometer 50 reduce the external 0 – 8 volt volume control range to an internal 3 – 4 volt range. The collectors of transistors 376 and 380 are applied to respective buffer transistors 408, 410 and 412, 414. Transistors 416 – 422 and their respective emitter load resistors 424 – 430 provide a load for the respective buffer transistors 408 – 414. The base of transistors 416 – 422 is connected to the bias network comprising resistor 432, diode 434 and resistor 436. The differential voltage applied to the multiplier 46R is taken from the emitters of transistors 410 and 414 while the differential voltage for the multiplier 46L is taken from the emitters of transistors 408 and 412. Diodes 438, 440 and 442 connect the collector of transistor 376 to the 8 volt bus. Diodes 444, 446 and 448 connect the collector of transistor 380 to the 8 volt bus. The diodes in the collector circuits of transistors 376 and 380 produce a logarithmic relationship between the differential voltage applied to the multipliers 46R and 46L and the differential voltage applied to amplifier 48. The three diodes in each collector circuit provide enough range of differential voltage to control the transistors of the multipliers 46R and 46L from saturation to cut-off. The amplifier 48 is operated over a narrow range which produces a linear relationship between the control voltage from the volume potentiometer 50 and attenuation in volume output in dB. This is accomplished by the sizing of the degeneration resistors 384 – 390.

The treble control differential amplifier 66 is similar to the amplifier 300 and comprises transistors 460 – 466, resistors 468 – 476 and diodes 478 and 480. The amplifier 66 is connected to the 8 volt bus through a diode 482. The reference voltage to the amplifier 66 is obtained from the junction between resistors 400 and 402 while the control voltage is supplied from the tone potentiometer 68 to the base of transistor 462. The collectors of transistors 462 and 460 are respectively connected to buffer transistors 484, 486 and 488, 490. Transistors 492 – 498 and their respective emitter resistors 500 – 506 provide the emitter load for the transistors 484 – 490. The differential voltage applied to the multiplier 62R is taken from the emitters of transistors 486 and 490 while the differential voltage applied to the multiplier 62L is taken from the emitters of transistors 484 and 488.

The bass control differential amplifier 84 is similar to the amplifier 66 and comprises transistors 508 – 514, resistors 516 – 524 and diodes 526 and 528. The amplifier 84 is connected to the 8 volt line through a diode 530. The bias for the amplifier 84 is applied to the base of transistors 510 from the collector of transistor 532 of the loudness control amplifier 86. The control voltage from the tone potentiometer 68 is applied to the base of transistor 508. The collectors of transistors 510 and 508 are respectively connected to buffer transistors 534 – 540. Transistors 542 – 548 and their respective emitter resistors 550 – 556 provide the emitter load for the transistors 534 – 540. The differential voltage applied to the multiplier 82R is taken from the emitters of transistors 536 and 540 while the differential voltage applied to the multiplier 82L is taken from the emitters of transistors 534 and 538. In addition to the transistor 532, the amplifier 86 comprises transistors 558 – 562 and resistors 564 – 570. Resistor 564 is connected with the emitter of transistor 338 as is the base of a transistor 572 which provides a level shifting function.

The details of the left signal processing channnel 26L are not shown in the interest of brevity. As previously indicated the circuitry for channel 26L is identical to channel 26R and would therefore conform to the details shown in FIG. 6. The connections with the control circuitry are indicated in FIG. 6a.

Having described our invention what we claim is:
1. Audio tone control apparatus providing a base tone control function comprising,
    signal processing means including a bass shaping network responsive to an audio voltage signal for producing a first modulated direct current signal the amplitude of which decreases with increasing frequency of said audio signal to effect a bass boost and for providing a second modulated direct current signal the amplitude of which increases with increasing frequency of said audio signal to effect a bass cut,
    current steering means for producing an output current which is a summation of complementary percentages of said first and second modulated direct current signals,
    means establishing a DC control voltage related to a desired bass response,
    a bass response control differential amplifier providing a differential output related to said DC control voltage,
    means applying the differential output of said bass response control differential amplifier to said current steering means for establishing said complementary percentages to thereby effect the desired bass response.
2. Audio tone control apparatus providing a bass tone control function comprising,
    signal processing means including a bass shaping network comprising first and second resistors interconnected in series by a capacitor, means for applying an audio signal across said bass shaping network, means responsive to the voltage on one side of said capacitor for producing a first modulated direct current signal the amplitude of which decreases with increasing frequency of said audio signal to effect a bass boost, means responsive to the voltage on the other side of said capacitor for producing a second modulated direct current signal the amplitude of which increases with increasing frequency of said audio signal to effect a bass cut,
    current steering means for producing an output current which is a summation of complementary percentages of said first and second signals,
    a bass response control differential amplifier having first and second control inputs and providing a differential output, means establishing a DC reference voltage at said first control input, means establishing a DC control voltage related to a desired bass response at said second control input,
    means applying the differential output of said differential amplifier to said current steering means for establishing said complementary percentages to effect the desired bass response.

3. Audio tone control apparatus providing treble and bass control functions comprising, signal processing means responsive to an audio voltage signal and including a treble section containing first and second signal paths, said first path including means for converting said audio signal to a first modulated direct current signal, said second path including a filter network for effecting a predetermined treble roll off in response to said audio signal and means for converting the output of said filter network to a second modulated direct current signal, a first current steering means for producing an output current which is a summation of complementary percentages of said first and second direct current signals, means for converting the output current of said current steering means to an audio voltage signal which is modified in accordance with a desired treble frequency response, a bass section responsive to said modified audio voltage signal for producing a third modulated direct current signal the amplitide of which decreases which increasing frequency of said modified audio signal to effect a bass boost and for producing a fourth modulated direct current signal the amplitude of which increases with increasing frequency of said modified audio signal to effect a bass cut, second current steering means for producing an output current which is a summation of complementary percentages of said third and fourth direct current signals, a treble response control differential amplifier having first and second control inputs and providing a differential output, means establishing a DC reference voltage at said first control input of said treble response control differential amplifier, a bass response control differential amplifier having first and second control inputs and providing a differential output, means establishing a DC reference voltage at said first control input of said bass response control differential amplifier, means applying a treble DC control voltage to the second input of said treble response control differential amplifier and a bass DC response control voltage at the second input of said bass response control differential amplifier, means applying the differential output of said treble response control differential amplifier to said first current steering means for establishing said complementary percentages to thereby effect the desired treble response, and means for applying the differential output of said bass response control differential amplifier to said second current steering means for establishing said complementary percentages to thereby effect the desired bass response.

4. The apparatus defined in claim 3 wherein the DC control voltages applied to said second control inputs of said treble response control differential amplifier and said bass response control differential amplifier are developed from a single potentiometer.

5. The apparatus defined in claim 3 wherein the reference voltage applied to said treble response control differential amplifier is constant, and the reference voltage applied to said bass response differential amplifier is developed by DC voltage control means and is variable as a function of a volume level setting.

6. Audio control apparatus providing a volume control function comprising, signal processing means responsive to an input audio voltage signal for providing a processed output audio signal wherein changes in level of said output signal as measured in dB are linearly related to changes in a DC control voltage, said signal processing means including means responsive to said input audio voltage signal for converting the voltage signal to a first modulated direct current signal representing the maximum volume level of said output audio signal, means for providing an unmodulated direct current representing a minimum volume level of said output audio signal, current steering means for producing an output current which is a summation of complementary percentages of said modulated and unmodulated direct current signals, a dual differential amplifier including first and second differential amplifiers having different gains, means providing a reference voltage for said dual differential amplifier, potentiometer means providing a DC control voltage input to said dual differential amplifier means, means applying the differential output of said dual differential amplifier to said current steering means for establishing said complementary percentages to thereby effect said changes in output level of said output audio signal.

7. The apparatus defined in claim 6 further comprising, means for converting the output current of said current steering means to a second audio voltage signal which is modified relative to said input audio signal in accordance with a desired volume level, a treble section containing first and second signal paths, said first path including means for converting said second audio signal to a second modulated direct current signal, said second signal path including a filter network for effecting a predetermined treble roll off in response to said second audio signal and means for converting the output of said filter network to a third modulated direct current signal, a second current steering means for producing an output current which is a summation of complementary percentages of said second and third direct current signals, means for converting the output current of said second current steering means to a third audio voltage signal which is modified relative to said second audio voltage signal in accordance with a desired treble frequency response, a bass section responsive to said third audio voltage signal for producing a fourth modulated direct current signal the amplitude of which decreases with increasing frequency of said third audio signal to effect a bass boost and for producing a fifth modulated direct current the amplitude of which increases with increasing frequency of said third audio signal to effect a bass cut, third current steering means for producing an output current which is a summation of complementary percentages of said fourth and fifth direct current signals, potentiometer means for establishing a DC tone control voltage, a treble response control differential amplifier having first and second control inputs and providing a differential output, means establishing a DC reference voltage at said first control input of said treble response control differential amplifier, a bass response control differential amplifier having first and second control inputs and providing a differential output, means establishing a DC reference voltage at said first control input of said bass response control differential amplifier, means applying said tone control voltage to the second input of said treble response control differential amplifier and to the second input of said bass response control differential amplifier, means applying the differential input of said treble response control differential amplifier to said second current steering means for establishing said complementary percentages to thereby effect the desired treble response, and means for applying the differential output of said bass response control differential amplifier to said third current steering means, for establishing said complementary percentages to thereby effect the desired bass response, and means for converting the current output of said third current steering means to an audio voltage signal.

8. Audio control apparatus providing volume and balance control functions in a multi-channel system comprising, left and right audio signal processing channels responsive respectively to left and right input audio voltage signals, said left signal processing channel including means for converting the left input audio voltage signal to a first modulated direct current representing the maximum volume level of said left audio signal, means providing a first unmodulated direct current representing a minimum volume level of said left audio signal, and current steering means for producing an output current which is a summation of complementary percentages of said modulated and unmodulated direct current signals, said right audio signal processing channel including means for converting said right input audio voltage signal to a second modulated direct current signal representing the maximum volume level of said right audio signal, means for providing a second unmodulated direct current representing the minimum volume level of said right audio signal, second current steering means for producing an output current which is a summation of complementary percentages of said second modulated and said second unmodulated direct current signals, said left and right signal processing channels further including third and fourth current steering means respectively, said third current steering means producing an output current which is a summation of complementary percentages of the output current of said first current steering multiplier and said first unmodulated direct current signals, said fourth current steering means producing an output current which is a summation of complementary percentages of the output of said second current steering multiplier and said second unmodulated direct current signal, means providing a balance DC control voltage, means providing a volume DC control voltage, first and second balance control differential amplifier means responsive to said balance DC control voltage for producing first and second differential output voltages, means for applying said first differential output voltage to one of the current steering means in said left signal processing channel and for applying said second differential output voltage to one of the current steering means in said right signal processing channel for controlling the percentages of the input currents contained in the output currents of said current steering means whereby the left audio signal is attenuated when said balanced DC control voltage is above a predetermined value and said right audio signal is attenuated when said balance control DC voltage is below said predetermined value, means providing a volume DC control voltage, volume control differential amplifier means including first and second differential amplifiers having different gains and responsive to said volume control DC voltage for providing a differential voltage to each of the other current steering means in said left and said right signal processing channels for establishing the percentage of input currents appearing in the output current thereof, whereby the left and right audio input signals are simultaneously controlled as a function of the volume DC control voltage to produce changes in audio output level as measured in dB which are linearly related to changes in said DC control voltage.

9. An audio volume control circuit in which changes in output level as measured in dB are linearly related to a change in control voltage said circuit comprising, current steering means for attenuating the level of an input audio signal by summing complementary percentages of a modulated direct current input representing said input signal and an unmodulated direct current, dual differential amplifier means including first and second differential amplifiers each including a pair of transistors having emitter, collector and base electrodes, a degeneration resistor connected with the emitter of each transistor for establishing different gains for said first and second differential amplifiers, and a plurality of diodes connected with the collector of one transistor of each differential amplifier, control potentiometer means coupled to the base of one transistor of each of said first and second differential amplifiers for applying a linearly changing DC control voltage thereto, means establishing a reference voltage at the base of the other transistor of each of said first and second differential amplifiers, and means applying the output obtained at a junction between said diodes and the collectors connected thereto to said current steering means to control the percentages of said modulated and unmodulated direct currents.

* * * * *